(12) United States Patent
Armstrong et al.

(10) Patent No.: US 7,135,851 B1
(45) Date of Patent: Nov. 14, 2006

(54) TERMINAL BLOCK PROBE AND PROBE KIT

(76) Inventors: Eric A. Armstrong, 8116 Castle Lake Rd., Indianapolis, IN (US) 46256; Ken Rhodes, 8932 Anchor Bay Dr., Indianapolis, IN (US) 46236

( * ) Notice: Subject to any disclaimer, the term of this patent is extended or adjusted under 35 U.S.C. 154(b) by 0 days.

(21) Appl. No.: 11/405,851

(22) Filed: Apr. 18, 2006

(51) Int. Cl.
*G01R 11/32* (2006.01)
(52) U.S. Cl. ..................................... 324/142
(58) Field of Classification Search ............... None
See application file for complete search history.

(56) References Cited

U.S. PATENT DOCUMENTS

| | | | |
|---|---|---|---|
| 3,893,027 A | 7/1975 | Veenendaal | |
| 4,209,742 A | 6/1980 | Bender et al. | |
| 5,512,839 A | 4/1996 | De Monaco | |
| 6,466,000 B1 | 10/2002 | Nightingale | |
| 6,566,855 B1* | 5/2003 | Nguyen et al. | 324/117 R |
| 6,603,297 B1 | 8/2003 | Gessford et al. | |
| 6,605,934 B1 | 8/2003 | Campbell et al. | |
| 6,731,117 B1 | 5/2004 | Slough | |
| 7,091,878 B1* | 8/2006 | Holle et al. | 340/870.02 |

* cited by examiner

*Primary Examiner*—Ha Tran Nguyen
*Assistant Examiner*—Trung Q. Nguyen
(74) *Attorney, Agent, or Firm*—Bruce J. Bowman

(57) ABSTRACT

A terminal block probe for taking electrical current measurements through an isolating terminal block by a multi-meter includes a tip configured as an isolating terminal block pin corresponding to the isolating terminal block pin of the particular isolating terminal block under test. This allows the probe to be releasably held by the terminal block for hands free testing. The probe tip includes two conductors adapted for contact with the isolating pin terminals of the terminal block. The terminal block probe includes a socket that releasably receives a plug of a multi-meter cable. Internal wiring of the probe extends from the socket and connects with the two conductors of the tip. When the plug of the multi-meter cable is received within the socket, the conductors of the tip are in electrical continuity with the wires of the multi-meter cable and thus the multi-meter. A kit of a plurality of isolating terminal block probes each having a differently configured tip corresponding to differently configured isolating terminal block pins of different isolating terminal blocks is also provided. Each probe of the kit has a socket that accepts the same plug of the same multi-meter cable.

13 Claims, 4 Drawing Sheets

TERMINAL BLOCK PROBE AND PROBE KIT

BACKGROUND OF THE INVENTION

1. Field of the Invention

The present invention pertains to devices for electrically testing amperage through terminal blocks and, more particularly, to probes for electrically testing amperage through terminal blocks utilizing a multi-meter. For example, current loops, such as, 0–20 mA or 4–20 mA signals.

2. Background Information

A terminal block is a device that provides and/or allows an electrical connection between two electrical elements or components. Terminal blocks are used in and for a variety of electrical situations and are easily mountable and replaceable. However, in some cases it is necessary to monitor the current passing through the terminals of a terminal block. This current monitoring is performed typically by a user using a multi-meter by placing the multi-meter's probes in series with the current loop.

To perform electrical tests using a multi-meter, a first probe having an electrically conducing tip is connected to either the positive or negative terminal of the multi-meter via an electrical cable while a second probe having an electrically conducting tip is connected to the other of the positive or negative terminal of the multi-meter via another electrical cable. The user selects an appropriate multi-meter function via a function (A or mA) selector on the multi-meter. Thereafter, a probe is grasped by each hand of the user and separately manipulated such that the electrically conducting tip of each probe is contacting an appropriate contact point.

With respect to an isolation terminal block, the terminal block, under normal operating condition, uses an isolating pin to jumper the opposing terminals. This isolating pin must first be removed before the probes can be used to perform the current test. Because most isolating terminal blocks are finger safe (contacting metal not exposed), it is oftentimes difficult to hold the probes in position to obtain the electrical measurement. Moreover, it is difficult to make adjustments to the multi-meter while holding the probes.

It is therefore evident from the above that there is a need for a better manner of performing current monitoring on terminal blocks using a multi-meter.

SUMMARY OF THE INVENTION

A terminal block probe for taking hands free current measurements through a terminal block by a multi-meter includes a tip configured as a terminal block isolating pin for the terminal block. The tip thus emulates a particular isolating pin for the terminal block, thereby temporarily holding the probe to the terminal block.

In one form, the terminal block probe tip has a body configured as a particular isolating pin for a particular terminal block. First and second conductors of the body are adapted for contact with conducting sockets of the terminal block. The terminal block probe further has a socket for releasable coupling with a plug of a multi-meter cable. Internal wiring extends from the socket to the first and second conductors of the tip to respectively connect the first and second conductors of the tip with the wires of the multi-meter cable when the multi-meter plug is inserted into the probe socket.

A kit of a plurality of terminal block probes is also provided wherein each terminal block probe has a differently configured tip corresponding to differently configured isolating pins for particular terminal blocks. Each probe of the kit has a socket that accepts the same plug of the same multi-meter cable.

The present terminal block probe and/or probe kit allow hands free current testing at the terminal block.

The present invention will be more apparent upon reading the following detailed description in conjunction with the accompanying drawings.

BRIEF DESCRIPTION OF THE DRAWINGS

The above mentioned and other features and objects of this invention, and the manner of attaining them, will become more apparent and the invention itself will be better understood by reference to the following description of embodiments of the invention taken in conjunction with the accompanying drawings, wherein.

Like reference numerals indicate the same or similar parts throughout the several figures.

DETAILED DESCRIPTION OF THE PREFERRED EMBODIMENT

Figure 1:
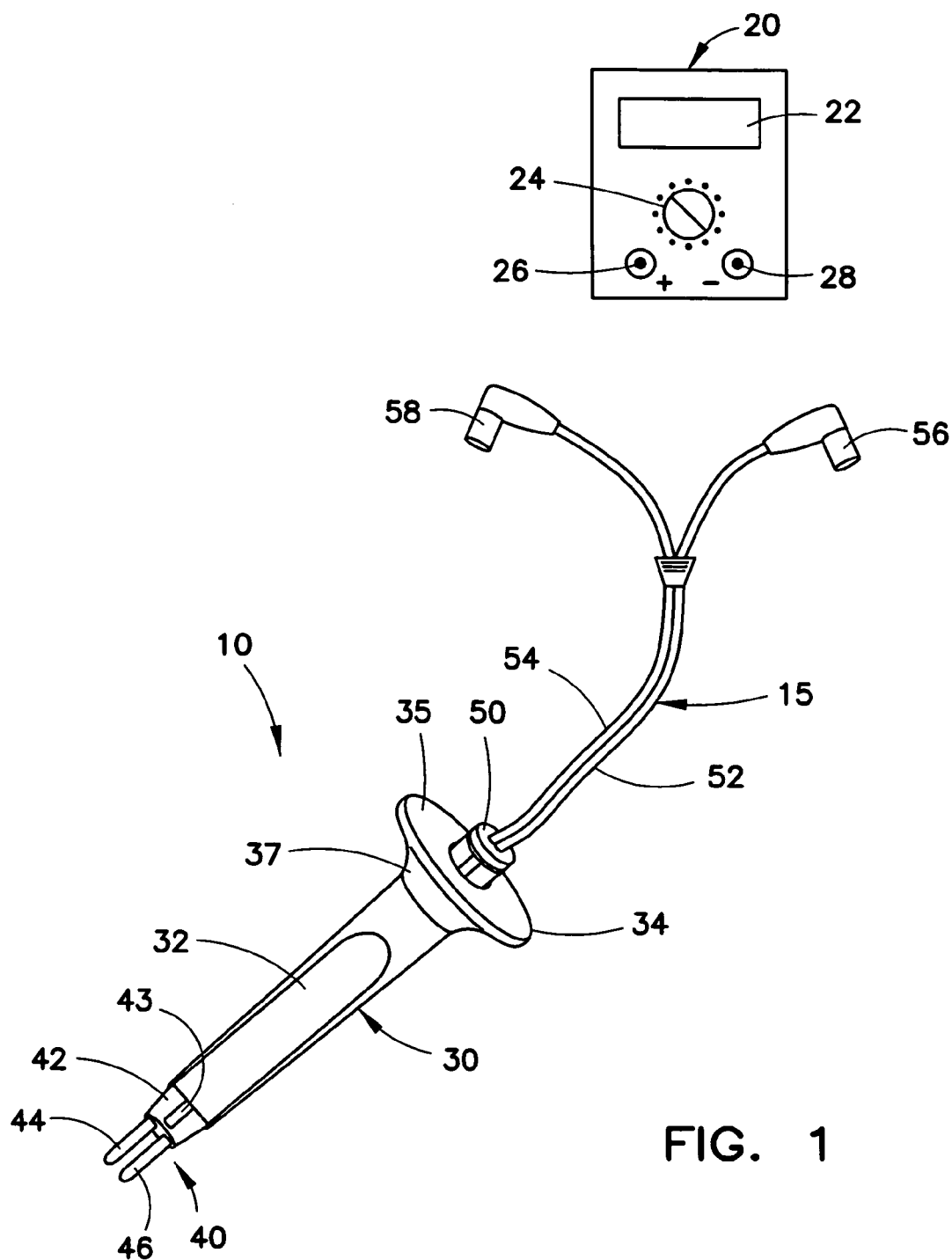
FIG. 1 is a perspective view of an exemplary terminal block probe fashioned in accordance with the present principles, the terminal block probe shown coupled to multi-meter leads and in relation to a multi-meter.

Referring to the figures, there is depicted an illustration of an exemplary terminal block probe generally designated 10 fashioned in accordance with the present principles. As depicted in FIG. 1, the terminal block probe 10 is shown coupled to a multi-meter cable 15 that is adapted for connection to a multi-meter 20 such as is known in the art.

The multi-meter 20 may be a digital and/or analog multi-meter. The multi-meter 20 includes a display or screen 22, a function selector 24, a positive (+) electrical input, terminal or socket 26 and a negative (−) electrical input, terminal or socket 28 all of which are typical and/or standard for multi-meters. The multi-meter 20 operates on battery power as necessary and includes features and/or functions that are typical for multi-meters such as current testing of various amperages or amperage ranges. The display 22 provides multi-meter information as appropriate for the selected function.

The multi-meter cable 15 has a first insulated electrical lead, wire or conductor 52 and a second insulated electrical lead, wire or conductor 54. The first lead 52 terminates in a first multi-meter plug 56. The second lead 54 terminates in a second multi-meter plug 58. The nomenclature first and second is arbitrary. The first and second leads 52, 54 and the first and second plugs 56, 58 are color coded black and red respectively as is typical in the art but may be any color, transparent or semi-transparent. The first plug 56 is configured to be received in the negative (−) electrical input socket 28 of the multi-meter 20 while the second plug 58 is configured to be received in the positive (+) electrical input socket 26 of the multi-meter 20. The multi-meter cable 15 also includes a probe plug 50 that is configured for electrical coupling with the probe 10 as described further below. The multi-meter cable 15 is thus configured for releasable coupling with both the multi-meter 20 and the probe 10 such that electrical signals may be transmitted from the probe 10 to the multi-meter 20 and vice versa as appropriate.

Figure 2:
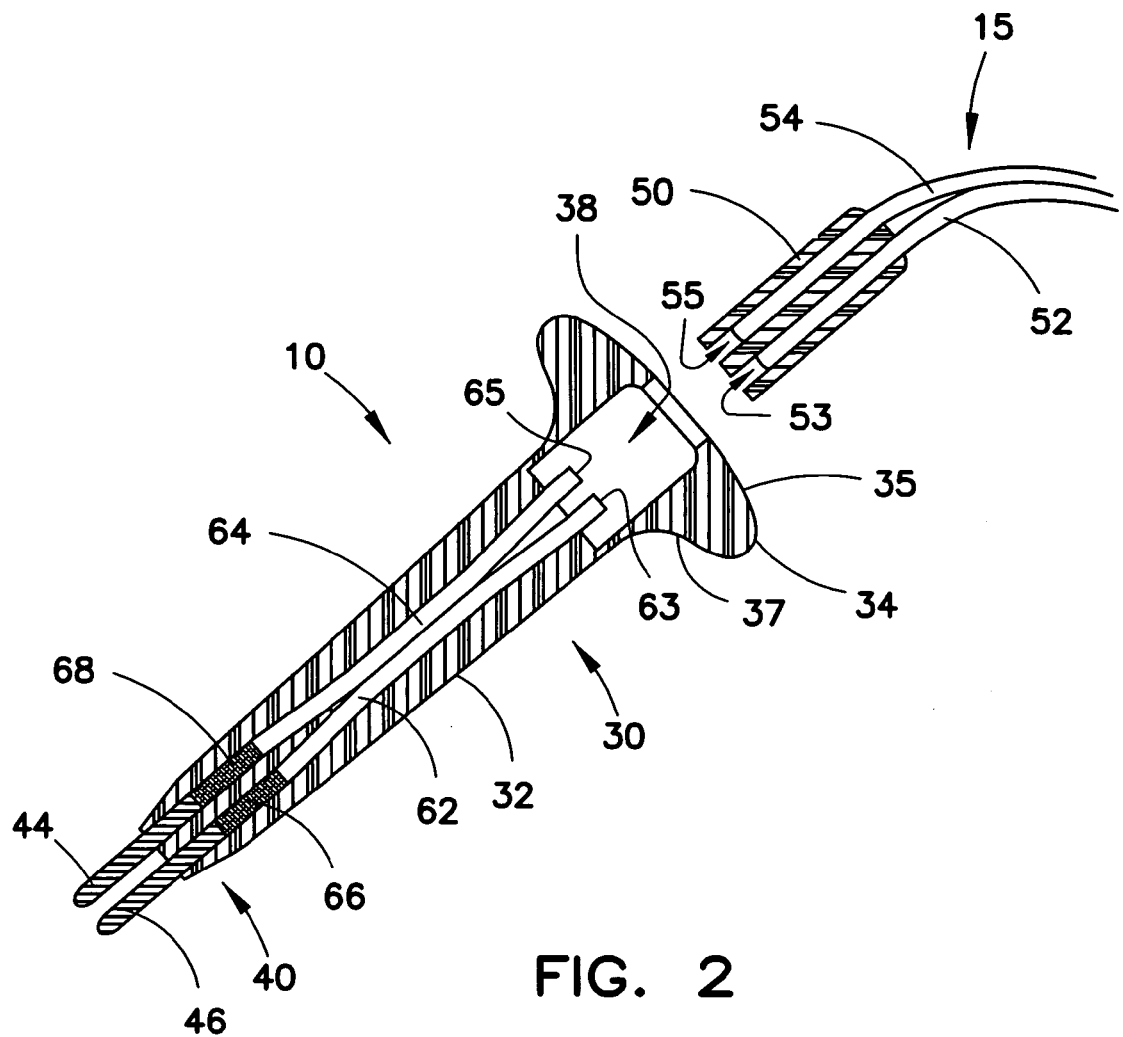
FIG. 2 is a cross-sectional view of the terminal block probe of FIG. 1 showing a plug portion of the multi-meter leads in cross-section and removed from a socket of the terminal block probe.

As best seen in FIGS. 1 and 2, the probe 10 is defined by a body 30 having a middle portion or section 32, an upper portion, section or head 34 and a lower portion, section or tip 40. The middle portion 32, the head 34 and at least a portion of the tip 40 is formed of an electrically insulating material such as a plastic, polymer, rubber or a combination of these materials or the like. Preferably, but not necessarily, the body 30 is formed as one piece.

The middle portion 32 is generally cylindrical-shaped tapering from the head 34 to the tip 40 and includes flats on both sides thereof. The shape and particularly the flats thereof, allow a user to easily grasp the probe 10 during use. The upper portion or head 34 extends from the middle portion 32 via an upwardly flaring portion 37. The head 34 is generally oval-shaped and has a generally flat upper surface 35. The body 30 encapsulates or includes two electrical wires, leads or conductors 63 and 65 each having additional sheathing or insulation 62 and 64, respectively. The probe may take other forms while having the same features described herein.

Figure 3:
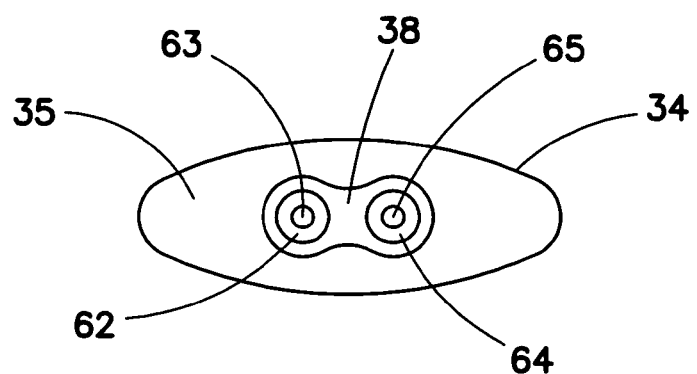
FIG. 3 is a top plan view of the terminal block probe of FIG. 1.

As best seen in FIGS. 2 and 3, the sheathed conductors 63, 65 extend into a socket or socket cavity 38 formed in the head 34. The socket 38 is configured for removable receipt of the plug 50 therein and for the electrical connection of the first and second leads 52, 54 of the multi-meter cable 15 to the conductors 63, 65 of the probe 10. In this manner, the cable 15 may be unplugged from and plugged into the probe (or a probe of multiple probes) as appropriate. In this manner, the probe 10 may be electrically coupled to the multi-meter 20 as appropriate.

The tip 40 of the probe 10 is defined by a body 42 encapsulating first and second electrically conducting prongs, terminals or the like 44, 46. As best seen in FIG. 2 the prongs 44, 46 are electrically connected at couplings 68, 66 respectively to conductors 63, 65 respectively. In this manner, the prong 46 becomes electrically coupled to the cable lead 52 while the prong 44 becomes electrically coupled to the cable lead 54 when the cable 15 (i.e. plug 50) is connected to the probe 10.

The tip 40 is configured to be received into the terminal bock in like manner as the isolating pin for that particular terminal block so as to test the current through the terminal block. As explained above, each type of terminal block typically has its own style or configuration of terminal block isolating pin that is releasably received by and in the terminal block. The isolating pin is used to provide the necessary electrical connection between separated terminal block terminals of the terminal block when in use. In accordance with the principles of the present invention, the tip of the terminal block probe is configured in like manner to a particular terminal block's isolating pin. In the exemplary terminal block probe 10, the tip 40 includes a vertical ridge 43 on the body 42 thereof and the prongs 44, 46 thereof are configured to be inserted into and reach the terminals of the terminal block. This holds the probe into the terminal block for hands free testing.

Figure 4:
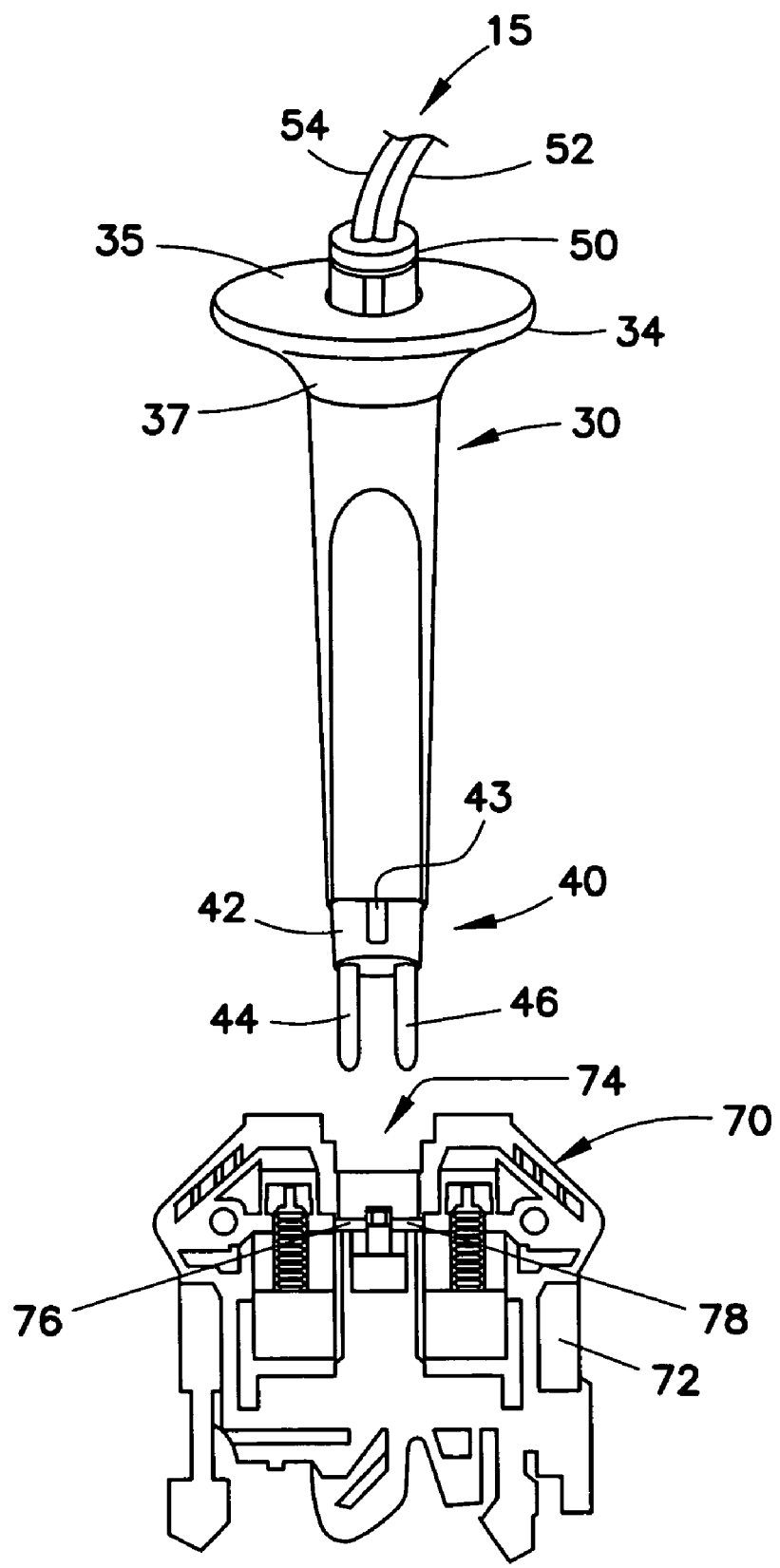
FIG. 4 is a side view of an exemplary terminal block depicted in sectional with the terminal block probe of FIG. 1 ready to be utilized to electrically test amperage through the terminal block.

FIG. 4 illustrates a manner in which the exemplary terminal block probe 10 is used in relation to the testing of current through a terminal block. An exemplary terminal block 70 is thus shown in a sectional view. The terminal block 70 is defined by a body 72 having a terminal block isolating pin socket 74 that is configured to receive a configured terminal block isolating pin (not shown). Electrical terminals 76 and 78 are disposed at the end of the terminal block socket 74 such that when the particular terminal block isolating pin (not shown) is inserted therein, the terminal block pin completes the connection between the electrical terminals 76, 78.

The terminal block probe 10 is shown ready to be inserted into the terminal block socket 74. The body of the terminal block probe 10 is thus configured in like manner to the terminal block isolating pin (not shown) for the terminal block 70. This releasably holds the probe onto the terminal block and the prongs of the tip onto the terminals of the terminal block. The multi-meter cable is coupled to the terminal block probe 10 by the reception of the plug 50 into the socket 38, shown in FIG. 2, of the probe body 30. While not shown, the leads 52, 54 of the multi-meter cable 15 are plugged into the appropriate multi-meter sockets 26 and 28.

The terminal block probe 10 may be inserted into the terminal block 70 with only one hand and release (and is thus intended therefore) to allow the both hands to work the multi-meter 20 as appropriate. The tip 40 and thus the body 42 thereof are configured to be releasably held in the terminal block 70 (i.e. the terminal block isolating pin socket 74). As such, the tip or body thereof is configured in like manner as the terminal block isolating pin for the particular terminal block.

The prongs 44, 46 of the tip 40 of the probe are thus configured to touch the terminals 76, 78 respectively when inserted into the socket 74. This allows the user to utilize his both hands to manipulate the function selector of the multi-meter or otherwise.

Figure 5:
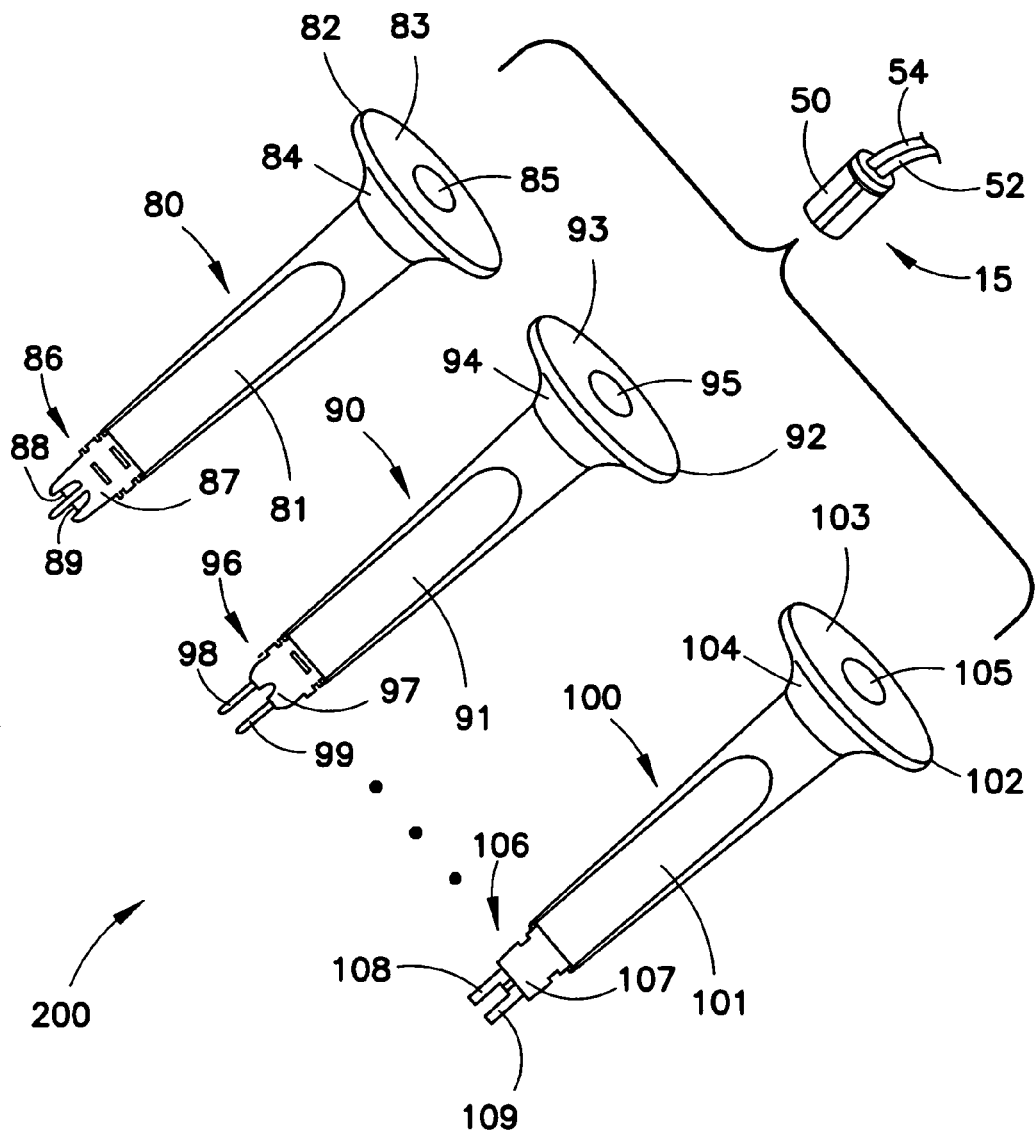
FIG. 5 is a view of multiple terminal block probes for various types of terminal blocks, each terminal block probe utilizing the same multi-meter electrical connector, the multiple terminal block probes constituting a kit.

Because each tip of a terminal block probe must be configured in like manner to the terminal block isolating pin used with the terminal block being used during testing, in accordance with an aspect of the present invention, reference is made to FIG. 5 wherein there is depicted a plurality of terminal block probes 200 constituting a terminal block probe kit. As indicated above this is because each style (configuration) of terminal block (usually by manufacturer) typically has its own style (configuration) of terminal block isolating pin and thus terminal block isolating pin socket. In order to provide hands free current testing through various isolating terminal blocks, it is necessary to have various isolating terminal block probes having different tips corresponding to the configuration of isolating pin for a particular terminal block.

FIG. 5 depicts three isolating terminal block probes 80, 90 and 100 representing any number of isolating terminal block probes that may constitute a kit of isolating terminal block probes for use with a multi-meter for testing current through any one of a number of terminal blocks. It should be appreciated that the representation of tips of the isolating terminal block probes are exemplary and not necessarily illustrative of any particular or true-to-life isolating terminal block pin design.

The isolating terminal block probe 80 is like probe 10 in composition, configuration and function. As such, the terminal block probe 80 and has a body 81, a head 82 and a tip 86. The head 82 is generally oval and extends from an upwardly flaring portion 84 of the body 81. A socket 85 is formed in the upper surface 83 of the head 82 and is configured to receive the plug 50 of the multi-meter cable 15. The tip 86 includes a configured body 87 having a first conducting blade, prong or terminal 88 and a second conducting blade, prong or terminal 89. The body 87 is configured as a particular terminal block isolating pin. This allows the probe to be temporarily held into the terminal block for hands free electrical (e.g. current) testing of the terminal block via the present terminal probe.

The isolating terminal block probe 90 is like probe 10 in composition, configuration and function. As such, the terminal block probe 90 and has a body 91, a head 92 and a tip 96. The head 92 is generally oval and extends from an upwardly flaring portion 94 of the body 91. A socket 95 is formed in the upper surface 93 of the head 92 and is configured to receive the plug 50 of the multi-meter cable 15. The tip 96 includes a configured body 97 having a first conducting prong or terminal 98 and a second conducting prong or terminal 99. The body 91 is configured as a particular terminal block isolating pin. This allows the probe to be temporarily held into the terminal block for hands free electrical (e.g. current) testing of the terminal block via the present terminal probe.

The isolating terminal block probe 100 is like probe 10 in composition, configuration and function. As such the terminal block probe 100 and has a body 101, a head 102 and a tip 106. The head 102 is generally oval and extends from an upwardly flaring portion 104 of the body 101. A socket 105 is formed in the upper surface 103 of the head 102 and is configured to receive the plug 50 of the multi-meter cable 15. The tip 106 includes a configured body 107 having a first conducting blade, prong or terminal 108 and a second conducting blade, prong or terminal 109. The body 101 is configured as a particular terminal block isolating pin. This allows the probe to be temporarily held into the terminal block for hands free electrical (e.g. current) testing of the terminal block via the present terminal probe.

Each socket 85, 95 and 105 is configured to receive the same plug 50 of the multi-meter cable such that only one multi-meter cable 15 is necessary to connect a isolating terminal block probe to the multi-meter 20. Thus, the socket 85 receives the plug 50 that, through internal wiring in like manner to the probe 10, couples the electrically conducting blade (prong) 89 of the tip 86 to the wire 52 and the electrically conducting blade (prong) 88 of the tip 86 to the wire 54. The socket 95 receives the plug 50 that, through internal wiring in like manner to the probe 10, couples the electrically conducting prong 99 of the tip 96 to the wire 52 and the electrically conducting prong 98 of the tip 96 to the wire 54. The socket 105 receives the plug 50 that, through internal wiring in like manner to the probe 10, couples the electrically conducting prong 109 of the tip 106 to the wire 52 and the electrically conducting prong 108 of the tip 106 to the wire 54.

While the invention has been illustrated and described in detail in the drawings and foregoing description, the same is to be considered as illustrative and not restrictive in character, it being understood that only a preferred embodiment has been shown and described and that all changes and modifications that come within the spirit of the invention are desired to be protected.

What is claimed is:

1. An electrical probe for use with a multi-meter, the electrical probe comprising:
    a body;
    a head disposed at one end of the body;
    a socket disposed in the head and adapted to receive a plug of a two-conductor multi-meter cable;
    a tip disposed at another end of the body, the tip configured as an isolating terminal block pin and having a first electrically conducting prong and a second electrically conducting prong;
    a first electrical conductor electrically coupled to the first electrically conducting prong and extending through the body and into the socket for electrical connection to one of the two conductors of the received two-conductor multi-meter plug; and
    a second electrical conductor electrically coupled to the second electrically conducting prong and extending through the body and into the socket for electrical connection to another one of the two conductors of the received two-conductor multi-meter plug.

2. The electrical probe of claim 1, wherein the socket is adapted to releasably receive the plug of the two-conductor multi-meter cable.

3. The electrical probe of claim 1, wherein the body is formed of an electrically insulating material.

4. The electrical probe of claim 1, wherein the head is essentially oval in shape, has a flat upper surface, and extends from an upwardly flared portion of and from the body.

5. The electrical probe of claim 1, wherein the body is generally a tapered cylinder having first and second flats on opposite sides thereof.

6. An isolating terminal block probe for use with a multi-meter for electrically testing current through a terminal block, the isolating terminal block probe comprising:
    an elongated, electrically insulating body;
    a head disposed at an upper end of the body;
    a socket disposed in the head and configured to receive a plug of a two-conductor multi-meter cable;
    a tip disposed at a lower end of the body and configured as an isolating terminal block pin corresponding to a terminal block to be tested, the tip having a first electrically conducting element and a second electrically conducting element;
    a first electrical conductor electrically coupled to the first electrically conducting element and extending through the body and into the socket for electrical connection to one of the two conductors of the received two-conductor multi-meter plug; and
    a second electrical conductor electrically coupled to the second electrically conducting element and extending through the body and into the socket for electrical connection to another one of the two conductors of the received two-conductor multi-meter plug.

7. The isolating terminal block probe of claim 6, wherein the socket is configured to releasably receive the plug of the two-conductor multi-meter cable.

8. The isolating terminal block probe of claim 6, wherein the head is essentially oval in shape, has a flat upper surface, and extends from an upwardly flared portion of and from the body.

9. The isolating terminal block probe of claim 6, wherein the body is generally a tapered cylinder having first and second flats on opposite sides thereof.

10. A kit for testing current through various isolating terminal blocks with a multi-meter, the kit comprising:
    a plurality of terminal block probes;

each one of the plurality of terminal block probes having an electrically insulating body, a head disposed at an upper end of the body, a socket disposed in the head, a tip having a first electrically conducting element and a second electrically conducting element and disposed at a lower end of the body, a first electrical conductor electrically coupled to the first electrically conducting element and extending through the body and into the socket, and a second electrical conductor electrically coupled to the second electrically conducting element and extending through the body and into the socket each tip of each one of the plurality of terminal block probes having a different configuration corresponding to an isolating terminal pin configuration of an isolating terminal block of the various isolating terminal blocks; and a two-conductor multi-meter cable having a probe plug configured for reception into the socket of each one of the plurality of terminal block probes and for electrical coupling with the first and second electrical conductors of the body that extend into the socket, and first and second multi-meter plugs for coupling with a multi-meter.

11. The kit of claim 10, wherein the socket of each one of the plurality of terminal block probes is configured to releasably receive the plug of the two-conductor multi-meter cable.

12. The kit of claim 10, wherein the head of each one of the plurality of terminal block probes is essentially oval in shape, has a flat upper surface, and extends from an upwardly flared portion of and from the body.

13. The kit of claim 10, wherein the body of each one of the plurality of terminal block probes is generally a tapered cylinder having first and second flats on opposite sides thereof.

* * * * *